US012725648B2

(12) United States Patent
Eun

(10) Patent No.: US 12,725,648 B2
(45) Date of Patent: Sep. 1, 2026

(54) MEMORY APPARATUS, REFRESH CONTROL CIRCUIT AND ROW HAMMER REFRESH METHOD

(71) Applicant: Winbond Electronics Corp., Taichung City (TW)

(72) Inventor: Chongoh Eun, Hsinchu (TW)

(73) Assignee: Winbond Electronics Corp., Taichung City (TW)

( * ) Notice: Subject to any disclaimer, the term of this patent is extended or adjusted under 35 U.S.C. 154(b) by 322 days.

(21) Appl. No.: 18/366,692

(22) Filed: Aug. 8, 2023

(65) Prior Publication Data

US 2025/0054533 A1 Feb. 13, 2025

(51) Int. Cl.
*G11C 11/406* (2006.01)

(52) U.S. Cl.
CPC ... *G11C 11/40611* (2013.01); *G11C 11/40603* (2013.01); *G11C 2211/4068* (2013.01)

(58) Field of Classification Search
CPC .................... G11C 11/40603; G11C 11/40611
USPC .......................................................... 365/222
See application file for complete search history.

(56) References Cited

U.S. PATENT DOCUMENTS 9,786,351 B2 10/2017 Lee et al.
9,818,469 B1 11/2017 Kim et al.
10,490,250 B1 * 11/2019 Ito ........................ G11C 11/4087
11,380,382 B2 7/2022 Zhang et al.
11,631,448 B1 4/2023 Lee et al.
2017/0140811 A1 5/2017 Joo
2018/0342282 A1 11/2018 Morgan
2022/0068361 A1 * 3/2022 Du ...................... G11C 11/4076
2023/0185460 A1 * 6/2023 Kim .................. G11C 11/40622 711/105

FOREIGN PATENT DOCUMENTS

TW I773203 8/2022

OTHER PUBLICATIONS

"Office Action of Taiwan Counterpart Application", issued on Nov. 8, 2024, p. 1-p. 7.

* cited by examiner

*Primary Examiner* — Anthan Tran
(74) *Attorney, Agent, or Firm* — JCIPRNET

(57) ABSTRACT

A memory apparatus, comprising: a command decoder, generating an external refresh command; a refresh skip divider, coupled to the command decoder, catching the external refresh command and outputting a divider signal; a row hammer circuit, generating a row hammer signal; and a refresh control circuit, coupled to the command decoder, the refresh skip divider and the row hammer circuit, wherein the refresh control circuit receives the external refresh command, the divider signal and the row hammer signal, and the refresh control circuit generates an internal refresh command according to the external refresh command, the divider signal and the row hammer signal.

8 Claims, 4 Drawing Sheets

MEMORY APPARATUS, REFRESH CONTROL CIRCUIT AND ROW HAMMER REFRESH METHOD

BACKGROUND

Technical Field

The disclosure relates to memory technology, and in particular to a memory apparatus, a refresh control circuit and a row hammer refresh method.

Description of Related Art

Dynamic Random Access Memory (DRAM) is a type of memory that stores each bit of data in a separate tiny capacitor within an integrated circuit. The capacitor can either be charged or discharged. DRAM requires regular refresh cycles to maintain data integrity, as each bit of data is stored in a separate capacitor which leaks charge over time.

Row hammering is a phenomenon in DRAM that can cause bit flips and thereby memory errors. It happens when one row of memory is accessed repeatedly, causing charge leakage in adjacent rows and potentially causing data loss or corruption in these adjacent rows. This is a security vulnerability because it can be exploited to gain unauthorized access to data.

DRAM typically incorporates row hammer protection. This mechanism involves tracing the target cell and periodically refreshing the victim cells. However, the row hammer refresh cycle can interfere with the normal refresh cycle, potentially leading to a degradation in refresh performance. The more row hammer refresh cycles occur, the more severe this degradation can become. Since refresh processes consume power, there is a need for mechanisms to reduce DRAM refresh loss.

SUMMARY

Accordingly, the disclosure provides a memory apparatus, a refresh control circuit and a row hammer refresh method, which mitigate normal refresh degradation by row hammer refresh and reduce row hammer refresh loss.

An embodiment of the disclosure provides a memory apparatus, comprising: a command decoder, generating an external refresh command; a refresh skip divider, coupled to the command decoder, catching the external refresh command and outputting a divider signal; a row hammer circuit, generating a row hammer signal; and a refresh control circuit, coupled to the command decoder, the refresh skip divider and the row hammer circuit, wherein the refresh control circuit receives the external refresh command, the divider signal and the row hammer signal, and the refresh control circuit generates an internal refresh command according to the external refresh command, the divider signal and the row hammer signal.

An embodiment of the disclosure provides a refresh control circuit, comprising: an AND gate, comprising a first input port, a second input port and a first output port; an OR gate, coupled to the AND gate, comprising a third input port, a fourth input port and a second output port; and a NOR gate, coupled to the OR gate, comprising a fifth input port, a sixth input port and a third output port, wherein the AND gate receives an external refresh command, the OR gate receives a divider signal, the NOR gate receives the divider signal and a row hammer signal, and the AND gate generates an internal refresh command.

An embodiment of the disclosure provides a row hammer refresh method, comprising: receiving an external refresh command, a divider signal and a row hammer signal; and generating an internal refresh command according to the external refresh command, the divider signal and the row hammer signal.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
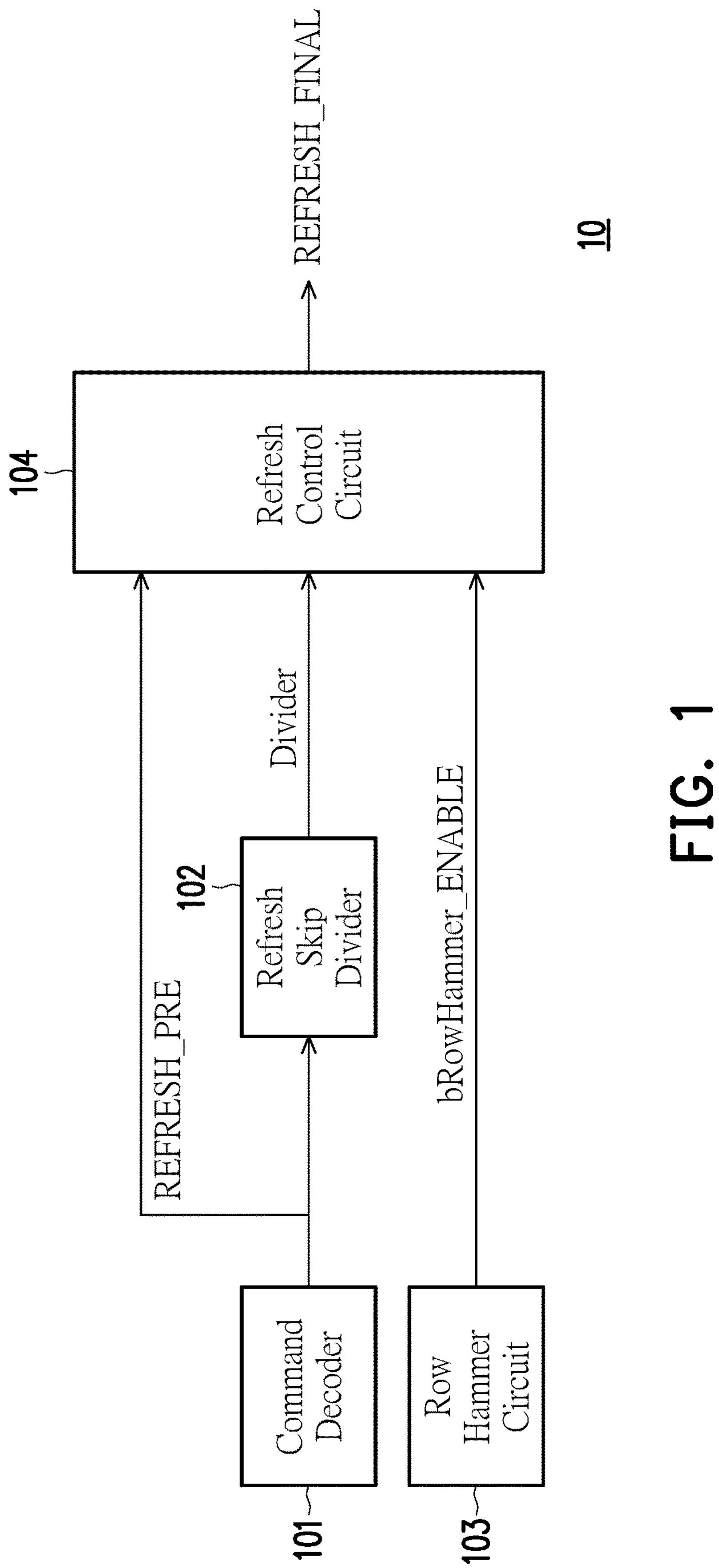
FIG. 1 is a schematic diagram of a memory apparatus in a first embodiment of the disclosure.

Some embodiments of the disclosure accompanied with the drawings will now be described in detail. For the reference numerals recited in description below, the same reference numerals shown in different drawings will be regarded as the same or similar elements. These embodiments are only a part of the disclosure, and do not disclose all the possible implementations of the disclosure. To be more precise, these embodiments are only examples of the appended claims of the disclosure. Wherever possible, elements/components/steps with the same reference numerals in the drawings and embodiments represent the same or similar parts. Cross-reference may be made between the elements/components/steps in different embodiments that are denoted by the same reference numerals or that have the same names.

FIG. 1 is a schematic diagram of a memory apparatus in a first embodiment of the disclosure. Referring to FIG. 1, memory apparatus 10 includes command decoder 101, refresh skip divider 102, row hammer circuit 103, and refresh control circuit 104. The command decoder 101 generates an external refresh command (REFRESH_PRE). The refresh skip divider 102 is coupled to the command decoder 101. The refresh skip divider 102 catches the external refresh command (REFRESH_PRE) and outputs a divider signal (Divider). The row hammer circuit 103 generates a row hammer signal (bRowHammer_ENABLE). The refresh control circuit 104 is coupled to the command decoder 101, the refresh skip divider 102 and the row hammer circuit 103. The refresh control circuit 104 receives the external refresh command (REFRESH_PRE), the divider signal (Divider), and the row hammer signal (bRowHammer_ENABLE). The refresh control circuit 104 generates an internal refresh command (REFRESH_FINAL) according to the external refresh command (REFRESH_PRE), the divider signal (Divider), and the row hammer signal (bRowHammer_ENABLE).

Concretely, command decoder 101 is responsible for receiving and interpreting commands from the external controller or processor. Command decoder 101 decodes the commands and generates signals for various operations in memory apparatus 10. Refresh skip divider 102 is a component used to manage the refresh process in memory apparatus 10. The refresh skip divider 102 determines the frequency at which the refresh operation needs to be performed, based on specifications and operating conditions of memory apparatus 10. Row hammer circuit 103 is designed to mitigate the effects of row hammering. Row hammering occurs when repeated accesses to neighboring rows in a memory array cause disturbance effect that can corrupt data or compromise system security. The row hammer circuit 103 may detect and prevent such disturbances in memory apparatus 10. Refresh control circuit 104 is responsible for managing and coordinating the refresh operation in memory apparatus 10. It generates the necessary signals to initiate the refresh process at the appropriate intervals, ensuring that data stored in the memory cells is periodically refreshed to prevent data loss or corruption.

In one embodiment, the divider signal (Divider) includes a high-voltage divider pulse and a low-voltage divider pulse. In one embodiment, in response to the refresh control circuit 104 receiving the high-voltage divider pulse and the row hammer signal (bRowHammer_ENABLE) is not enabled, the refresh control circuit 104 passes the external refresh command (REFRESH_PRE) to generate the internal refresh command (REFRESH_FINAL). In one embodiment, in response to the refresh control circuit 104 receiving the low-voltage divider pulse and the row hammer signal (bRowHammer_ENABLE) is not enabled, the refresh control circuit 104 blocks the external refresh command (REFRESH_PRE) and the refresh control circuit 104 does not generate the internal refresh command (REFRESH_FINAL). In one embodiment, in response to the refresh control circuit 104 receiving the low-voltage divider pulse (Divider0) and the row hammer signal (bRowHammer_ENABLE) is enabled, the refresh control circuit 104 passes the external refresh command (REFRESH_PRE) to generate the internal refresh command (REFRESH_FINAL). In one embodiment, in response to the refresh control circuit 104 receiving the high-voltage divider pulse and the row hammer signal (bRowHammer_ENABLE) is enabled, the refresh control circuit 104 blocks the external refresh command (REFRESH_PRE) and the refresh control circuit 104 does not generate the internal refresh command (REFRESH_FINAL).

Figure 2:
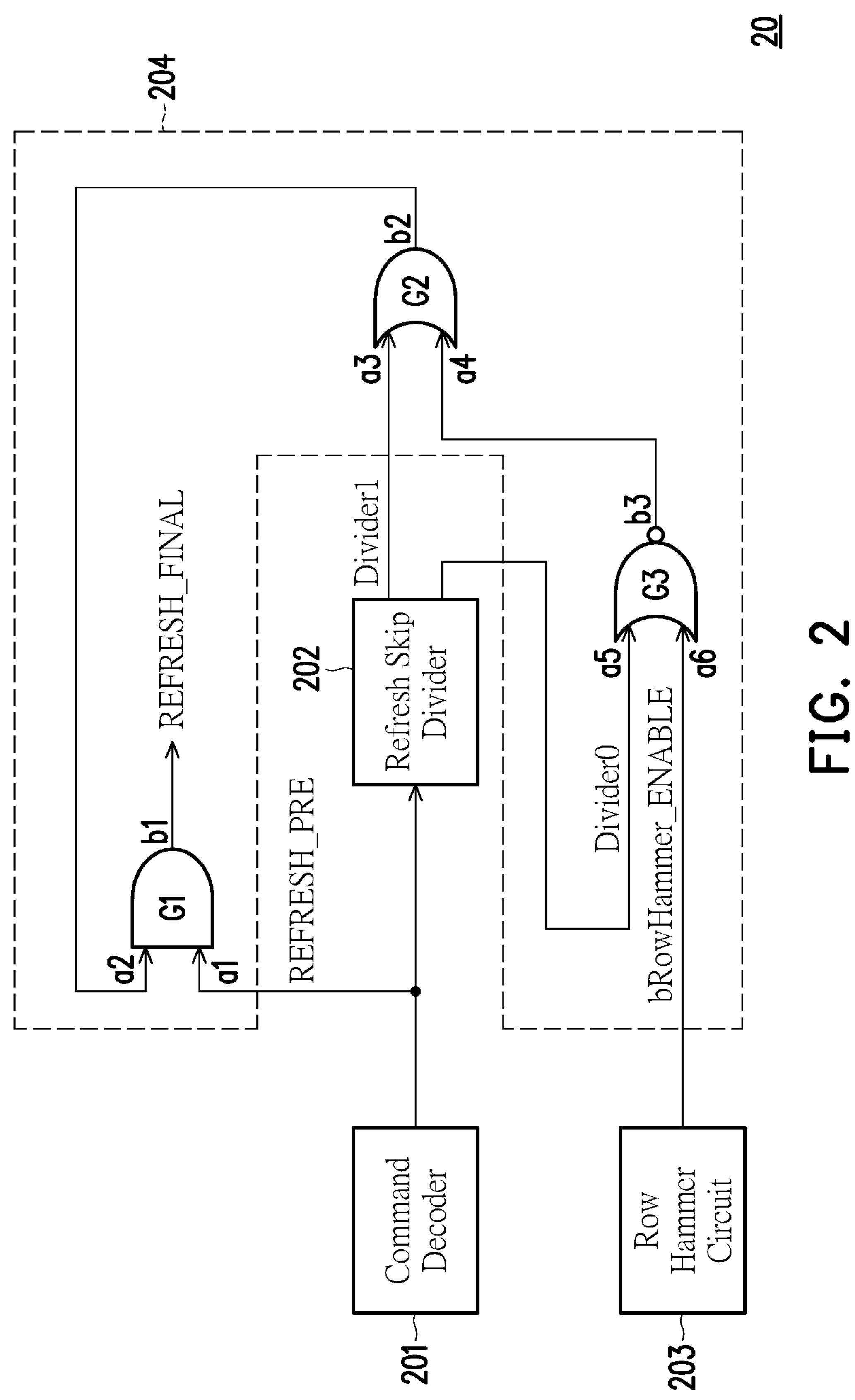
FIG. 2 is a schematic diagram of a memory apparatus in a second embodiment of the disclosure.

FIG. 2 is a schematic diagram of a memory apparatus in a second embodiment of the disclosure. Referring to FIG. 2, memory apparatus 20 includes command decoder 201, refresh skip divider 202, row hammer circuit 203, and refresh control circuit 204. In this embodiment, the command decoder 201, the refresh skip divider 202, and the row hammer circuit 203 are the same as the command decoder 101, the refresh skip divider 102, and the row hammer circuit 103 in FIG. 1, respectively.

In FIG. 2, the refresh control circuit 204 includes logic gates G1, G2 and G3. In one embodiment logic gate G1 is an AND gate. Logic gate G1 includes input ports a1, a2, and an output port b1. In one embodiment, logic gate G2 is an OR gate. Logic gate G2 is coupled to logic gate G1. Logic gate G2 includes input ports a3, a4 and an output port b2. In one embodiment, logic gate G3 is a NOR gate. Logic gate G3 is coupled to logic gate G2. Logic gate include input ports a5, a6 and an output port b3.

In one embodiment, logic gate G1 receives external refresh command (REFRESH_PRE) from command decoder 201. Logic gate G2 receives divider signal (Divider1) from refresh skip divider 202. Logic gate G3 receives divider signal (Divider0) from refresh skip divider 202 and row hammer signal (bRowHammer_ENABLE) from row hammer circuit 203. Logic gate G1 generates internal refresh command (REFRESH_FINAL).

In one embodiment, the input port a1 of the AND gate G1 receives the external refresh command (REFRESH_PRE). The output port b1 of the AND gate G1 outputs the internal refresh command (REFRESH_FINAL). The input port a2 of the AND gate G1 is connected to the output port b2 of the OR gate G2.

In one embodiment, the divider signal, as referred as (Divider) in FIG. 1 includes divider signals (Divider1) and (Divider0) as shown in FIG. 2. The divider signal (Divider1) is a high-voltage divider pulse. The divider signal (Divider0) is a low-voltage divider pulse.

In one embodiment, input port a3 of the OR gate G2 receives the high-voltage divider pulse (Divider1), and input port a4 of the OR gate G2 is connected to output port b3 of the NOR gate G3. In one embodiment, input port a5 of the NOR gate G3 receives the low-voltage divider pulse (Divider0), and input port a6 of the NOR gate G3 receives the row hammer signal (bRowHammer_ENABLE).

In one embodiment, in response to input port a3 of the OR gate G2 receiving the high-voltage divider pulse (Divider1) and the row hammer signal (bRowHammer_ENABLE) is not enabled, the AND gate G1 passes the external refresh command (REFRESH_PRE) to generate the internal refresh command (REFRESH_FINAL). In one embodiment, in response to input port a5 of the NOR gate G3 receiving the low-voltage divider pulse (Divider0) and the row hammer signal (bRowHammer_ENABLE) is not enabled, the AND gate G1 blocks the external refresh command (REFRESH_PRE) and does not generate the internal refresh command (REFRESH_FINAL). In one embodiment, in response to input port a5 of the NOR gate G3 receiving the low-voltage divider pulse (Divider0) and the row hammer signal (bRowHammer_ENABLE) is enabled, the AND gate G1 passes the external refresh command (REFRESH_PRE) to generate the internal refresh command (REFRESH_FINAL). In one embodiment, in response to input port a3 of the OR gate G2 receiving the high-voltage divider pulse (Divider1) and the row hammer signal (bRowHammer_ENABLE) is enabled, the AND gate G1 blocks the external refresh command (REFRESH_PRE) and does not generate the internal refresh command (REFRESH_FINAL).

Figure 3:
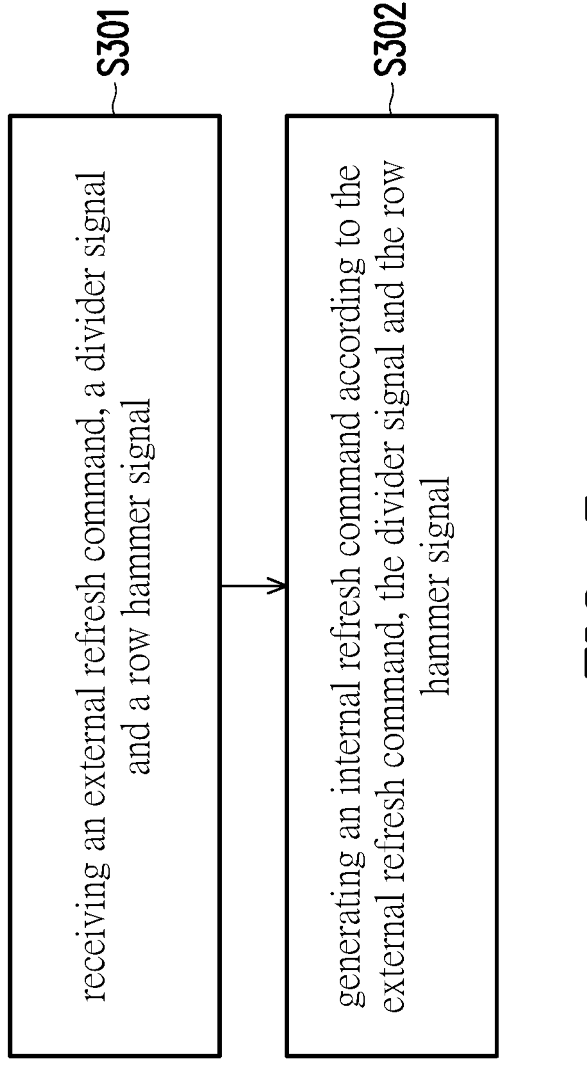
FIG. 3 is a flowchart of a row hammer refresh method according to an embodiment of the disclosure.

FIG. 3 is a flowchart of a row hammer refresh method according to an embodiment of the disclosure. In step S301, receiving an external refresh command, a divider signal and a row hammer signal. In step S302, generating an internal refresh command according to the external refresh command, the divider signal and the row hammer signal. In one embodiment, the divider signal comprising a high-voltage divider pulse and a low-voltage divider pulse. In one embodiment, in response to receiving the high-voltage divider pulse and the row hammer signal is not enabled, passing the external refresh command to generate the internal refresh command. In one embodiment, in response to receiving the low-voltage divider pulse and the row hammer signal is not enabled, blocking the external refresh command and the internal refresh command is not generated. In one embodiment, in response to receiving the low-voltage and the row hammer signal is enabled, passing the external refresh command to generate the internal refresh command.

In one embodiment, in response to receiving the high-voltage divider pulse and the row hammer signal is enabled, blocking the external refresh command and the internal refresh command is not generated.

In view of the above embodiments, the disclosure optimizes the performance of DRAM cells by reducing the power consumption associated with refresh cycles. When the DRAM cells exhibit minimal leakage current, there is an opportunity to skip the external refresh command, and consequently saving refresh power. It is worth noting that when the refresh skip is implemented, the normal refresh degradation caused by row hammering becomes more severe. The disclosure mitigates the issue by a row hammer refresh mechanism that operates during the refresh skip period. This mechanism ensures that the normal refresh cycle is maintained while eliminating any potential loss resulting from row hammer refresh. Concretely, this is realized by the refresh control circuit 104 to control the internal refresh command accordingly.

When the divider signal is "1" (Divider1), the external refresh command (REFRESH_PRE) is passed through to the internal refresh command (REFRESH_FINAL), ensuring that the normal refresh cycle proceeds as intended. On the other hand, when the divider pulse is "0", the external refresh command (REFRESH_PRE) signal is blocked, the generation of an internal refresh command (REFRESH_FINAL) is prevented.

During the row hammer-enabled state (that is, the row hammer signal bRowHammer_ENABLE is "0"), the external refresh command is enabled only when the divider signal is "0" (Divider0). This means that normal refresh cycles occur without any loss due to row hammering.

Figure 4:
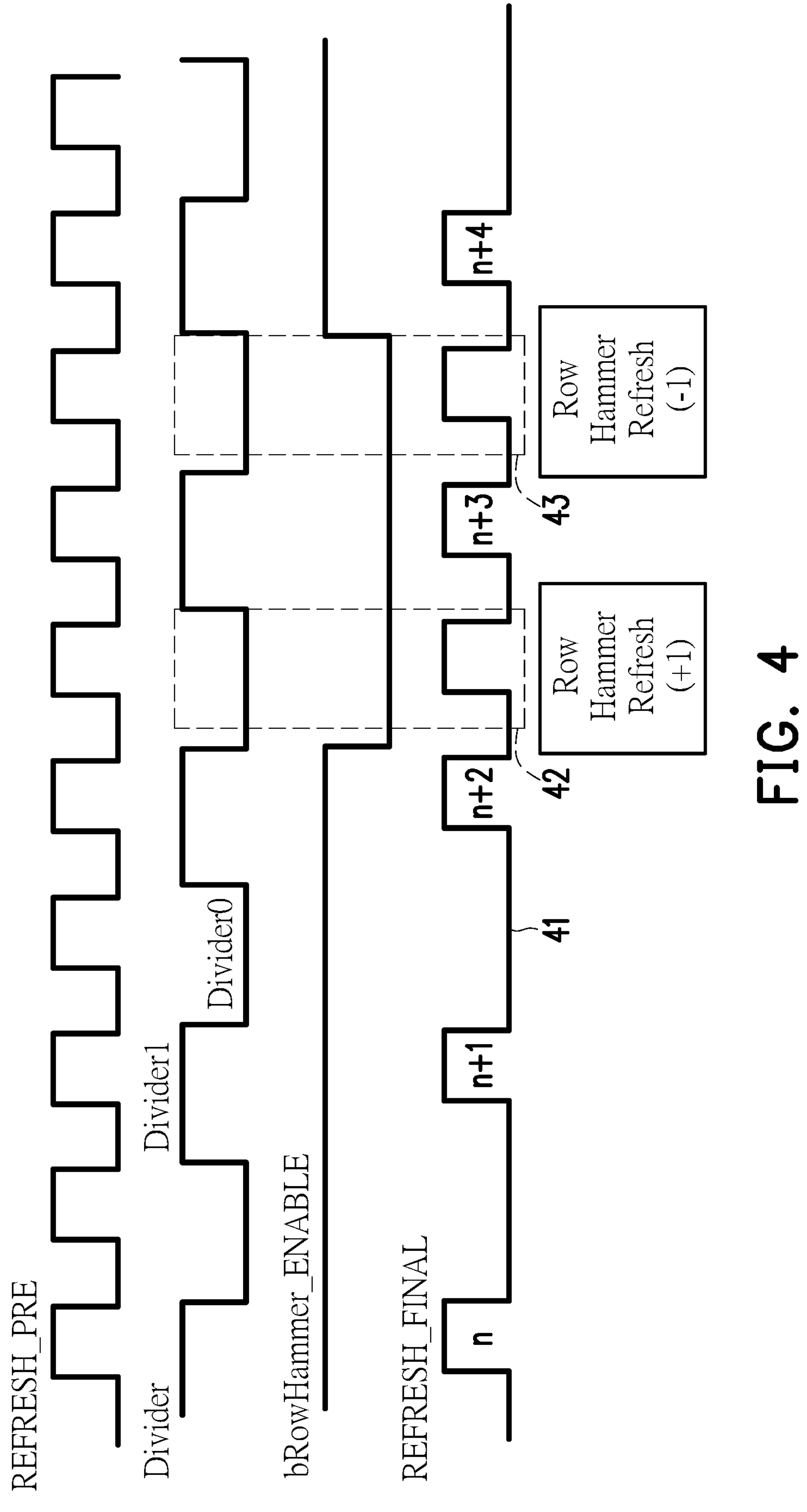
FIG. 4 is an example of signal timing flow diagram to illustrate row hammer refresh in an embodiment of the disclosure.

FIG. 4 is an example of signal timing flow diagram to illustrate row hammer refresh in an embodiment of the disclosure. The timing flow as shown in FIG. 4 provides a detailed description of row hammer refresh in an embodiment of the disclosure for cells n, n+1, n+2, n+3 and n+4. Taking cell n+3 as a target cell as an example, FIG. 4 shows that the row hammer refresh addresses (target+1, target−1), see cycles 42 and 43 in FIG. 4, are specifically targeted and executed only during the "refresh skip" periods (cycles 42 and 43) when the divider output is "0" (Divider0). Consequently, there is no normal refresh loss incurred during this process. Namely, no normal refresh loss in cycle 41 as shown in FIG. 4.

The disclosure optimizes the performance of DRAM cells by reducing refresh power consumption while mitigating the degradation caused by row hammering. By implementing a refresh skip mechanism when the leakage current in DRAM cells is low, external refresh commands can be internally skipped, conserving power. To address the potential degradation in normal refresh cycles due to row hammering, a row hammer refresh is performed during the refresh skip period such that the normal refresh cycle remains intact while reducing any loss associated with row hammering. A refresh control circuit is introduced to control the flow of external and internal refresh commands based on divider signal pulses. Additionally, during row hammer-enabled states, external refresh commands are only allowed during specific conditions to avoid normal refresh loss and hence effectively reduce refresh power consumption while maintaining data integrity.

Examples of memory apparatus 10 or 20 include Random Access Memory (RAM), such as Dynamic RAM (DRAM) or Static RAM (SRAM), commonly used in computers, laptops, and servers for fast data access; Flash memory found in USB flash drives, solid-state drives (SSDs), and memory cards, providing non-volatile storage for portable devices; Read-Only Memory (ROM), like firmware in computers and gaming consoles, which stores permanent pre-recorded data; Cache memory, such as L1 and L2 cache, used in computer systems to store frequently accessed data closer to the processor for faster access; Graphics Memory (VRAM) in graphics cards and GPUs, dedicated to storing graphical data for smooth image rendering; and Disk cache, acting as a buffer between main memory and hard disk drives, storing frequently accessed data.

Examples of command decoder 101 and 201 in DRAM include dedicated circuitry or logic designed to receive and interpret commands from the memory controller. This circuitry may include multiplexers, decoders, and control logic that analyze the incoming command signals and determine the appropriate memory operations to be performed, such as read, write, or refresh. It may also include timing circuits to synchronize the execution of commands with the internal clock of the DRAM. The command decoder 101 and 201 enables DRAM to efficiently process and execute commands from the memory controller, facilitating the seamless interaction between the processor or system and the memory subsystem.

Examples of refresh skip divider 102 and 202 in DRAM include a frequency divider. A frequency divider is a circuit that takes an input clock signal and generates an output clock signal with a reduced frequency. In the context of a refresh skip divider, it is used to determine the frequency at which the refresh operation needs to be performed in DRAM. By dividing the frequency of the input clock signal, the refresh skip divider can control the rate at which the refresh process occurs, optimizing it based on the memory's specifications and operating conditions.

Examples of row hammer circuit 103 and 203 include a dedicated hardware circuitry integrated into a memory controller. This circuitry may monitor memory access patterns and detect repetitive accesses to neighboring rows within a memory array. When such patterns are identified, the row hammer circuit intervenes by dynamically reordering or delaying memory access requests to prevent the row hammering effect. Examples of row hammer circuit 103 and 203 may utilize techniques like row isolation or forced refresh cycles to mitigate the disturbance caused by repeated row accesses. Additionally, examples of row hammer circuit 103 and 203 may work in conjunction with software-based mitigation techniques to further enhance the protection against row hammer vulnerabilities.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory apparatus, comprising:

a command decoder, generating an external refresh command;

a refresh skip divider, coupled to the command decoder, catching the external refresh command and outputting a divider signal;

a row hammer circuit, generating a row hammer signal; and a refresh control circuit, coupled to the command decoder, the refresh skip divider and the row hammer circuit, wherein the refresh control circuit receives the external refresh command, the divider signal and the row hammer signal, and the refresh control generates an internal refresh command according to the divider signal and the row hammer signal, the divider signal comprising a high-voltage divider pulse and a low-voltage divider pulse, and in response to the refresh control circuit receiving the high-voltage divider pulse and the row hammer signal is not enabled, the refresh control circuit passes the external refresh command to generate the internal refresh command.

2. The memory apparatus of claim 1, wherein in response to the refresh control circuit receiving the low-voltage divider pulse and the row hammer signal is not enabled, the refresh control circuit blocks the external refresh command and the refresh control circuit does not generate the internal refresh command.

3. The memory apparatus of claim 1, wherein in response to the refresh control circuit receiving the low-voltage divider pulse and the row hammer signal is enabled, the refresh control circuit passes the external refresh command to generate the internal refresh command.

4. The memory apparatus of claim 1, wherein in response to the refresh control circuit receiving the high-voltage divider pulse and the row hammer signal is enabled, the refresh control circuit blocks the external refresh command and the refresh control circuit does not generate the internal refresh command.

5. A row hammer refresh method, comprising:

receiving an external refresh command, a divider signal and a row hammer signal; and generating an internal refresh command according to the divider signal and the row hammer signal, wherein:

the divider signal comprising a high-voltage divider pulse and a low-voltage divider pulse; and in response to receiving the high-voltage divider pulse and the row hammer signal is not enabled, passing the external refresh command to generate the internal refresh command.

6. The row hammer refresh method of claim 5, further comprising:

in response to receiving the low-voltage divider pulse and the row hammer signal is not enabled, blocking the external refresh command and the internal refresh command is not generated.

7. The row hammer refresh method of claim 5, further comprising:

in response to receiving the low-voltage divider pulse and the row hammer signal is enabled, passing the external refresh command to generate the internal refresh command.

8. The row hammer refresh method of claim 5, further comprising:

in response to receiving the high-voltage divider pulse and the row hammer signal is enabled, blocking the external refresh command and the internal refresh command is not generated.

* * * * *